(12) United States Patent
Lee et al.

(10) Patent No.: US 9,484,290 B2
(45) Date of Patent: Nov. 1, 2016

(54) ELECTRONIC SYSTEM WITH A COMPOSITE SUBSTRATE

(71) Applicant: CYNTEC CO., LTD., Hsinchu (TW)

(72) Inventors: Han-Hsiang Lee, Taipei (TW); Jeng-Jen Li, Taipei (TW); Kun-Hong Shih, Hsinchu (TW)

(73) Assignee: CYNTEC Co, Ltd., Hsinchu (TW)

( * ) Notice: Subject to any disclaimer, the term of this patent is extended or adjusted under 35 U.S.C. 154(b) by 237 days.

(21) Appl. No.: 13/969,604

(22) Filed: Aug. 18, 2013

(65) Prior Publication Data

US 2013/0328181 A1    Dec. 12, 2013

Related U.S. Application Data

(63) Continuation-in-part of application No. 12/705,389, filed on Feb. 12, 2010, now Pat. No. 8,547,709.

(51) Int. Cl.

| | |
|---|---|
| H05K 5/02 | (2006.01) |
| H01L 23/495 | (2006.01) |
| H05K 1/02 | (2006.01) |
| H05K 7/14 | (2006.01) |
| H01L 23/13 | (2006.01) |
| H02M 3/00 | (2006.01) |
| H05K 3/00 | (2006.01) |

(52) U.S. Cl.
CPC ... *H01L 23/49575* (2013.01); *H01L 23/49531* (2013.01); *H01L 23/49541* (2013.01); *H05K 1/021* (2013.01); *H05K 7/1432* (2013.01); *H01L 23/13* (2013.01); *H01L 2224/49175* (2013.01); *H02M 3/00* (2013.01); *H05K 3/0061* (2013.01); *H05K 2201/1034* (2013.01); *H05K 2201/10924* (2013.01); *H05K 2203/1327* (2013.01)

(58) Field of Classification Search
CPC .................. H01L 23/49575; H01L 23/49531; H01L 23/49541; H01L 23/13; H01L 2224/49175; H05K 1/021; H05K 7/1432; H05K 3/0061; H05K 2201/10924; H05K 2203/1327; H05K 2201/1034; H02M 3/00
See application file for complete search history.

(56) References Cited

U.S. PATENT DOCUMENTS

2004/0238857 A1* 12/2004 Beroz ................ H01F 17/0033
                                                                                               257/232

* cited by examiner

*Primary Examiner* — Hoa C Nguyen
(74) *Attorney, Agent, or Firm* — Min-Lee Teng; Litron Patent & Trademark Office

(57) ABSTRACT

A composite substrate made of a conductive pattern structure mounted on a lead frame is used for an electronic system package. High heat generated electronic components are adapted to mount on the lead frame and relatively low heat generated electronic components are adapted to mount on the conductive pattern structure. Metal lines are used for electrical coupling between the circuitry of the IC chip and the conductive pattern structure. An electronic system with the composite substrate gains both advantages—good circuitry arrangement capability from the conductive pattern structure and good heat distribution from the lead frame.

16 Claims, 16 Drawing Sheets

(US 6,212,086)

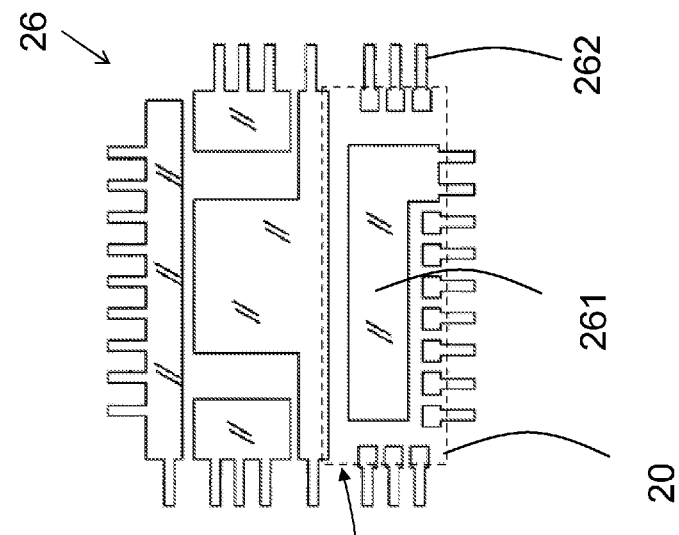
Fig. 2C
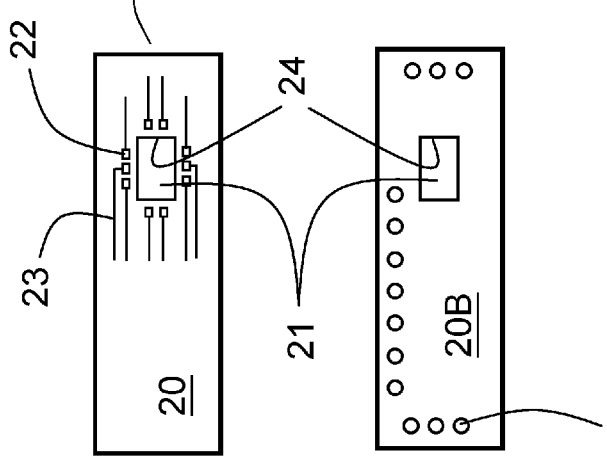
Fig. 2A
Fig. 2B

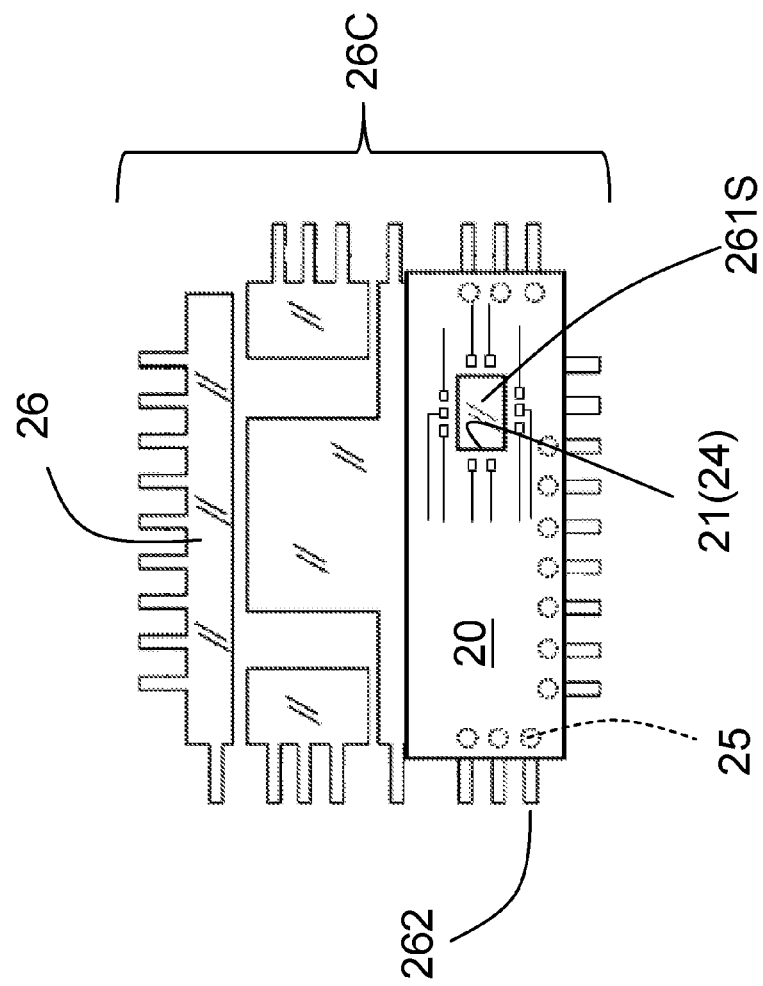

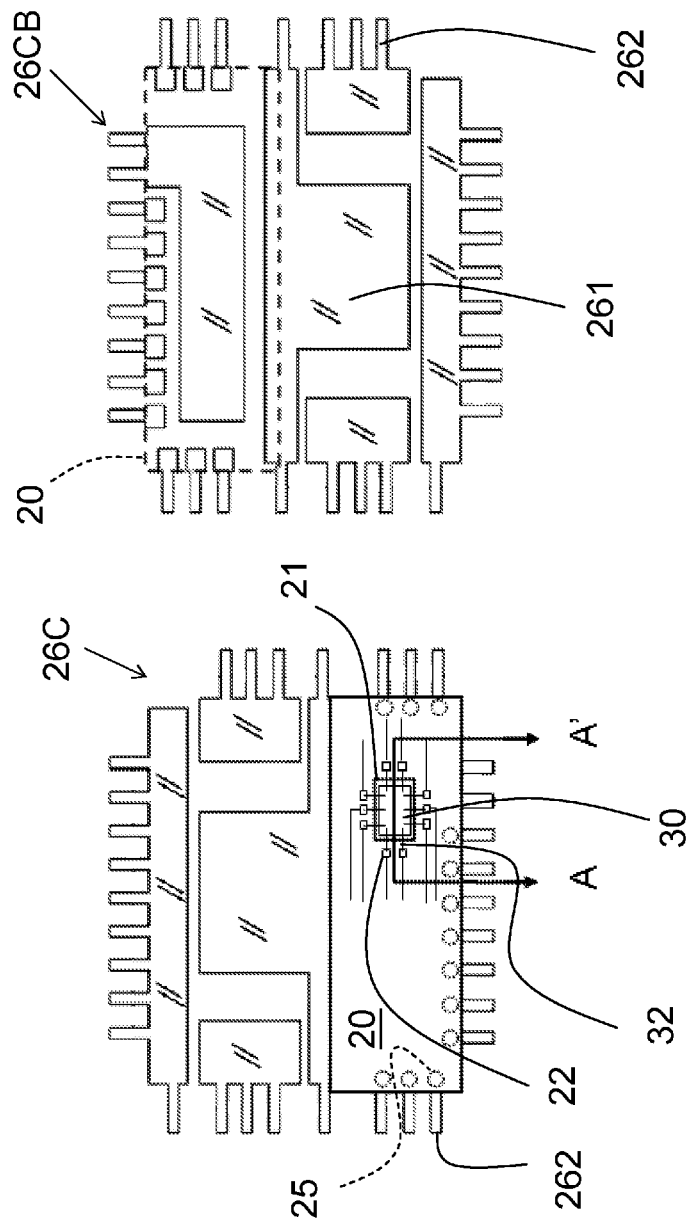

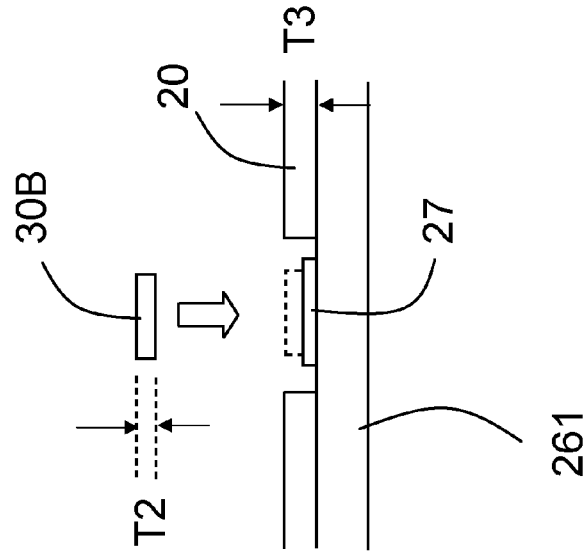
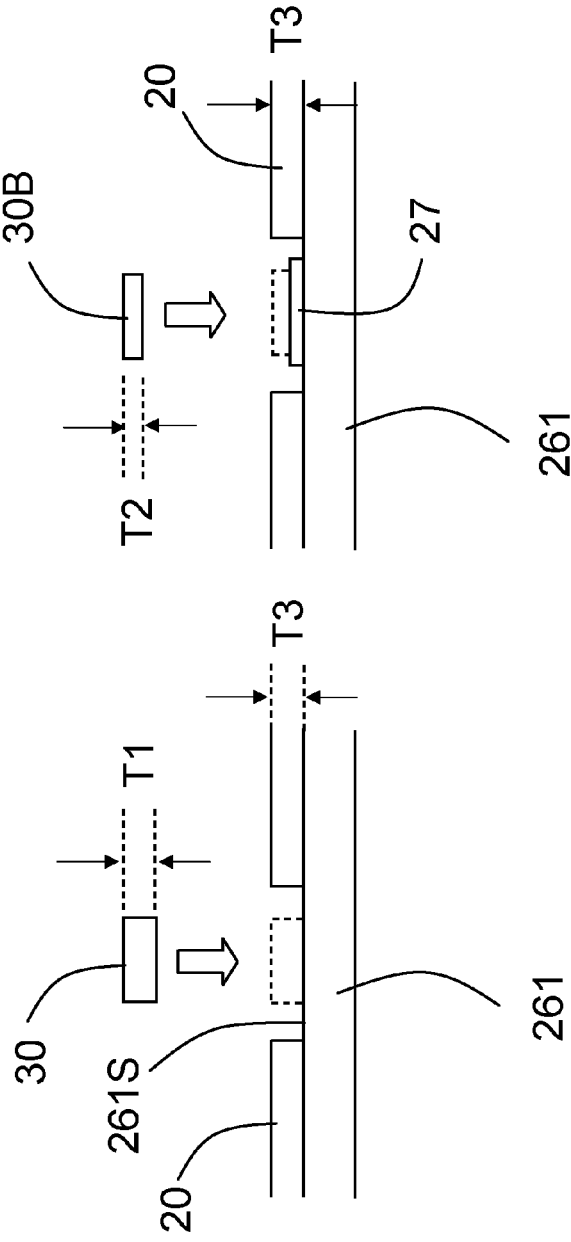
Fig. 4C
Fig. 4D

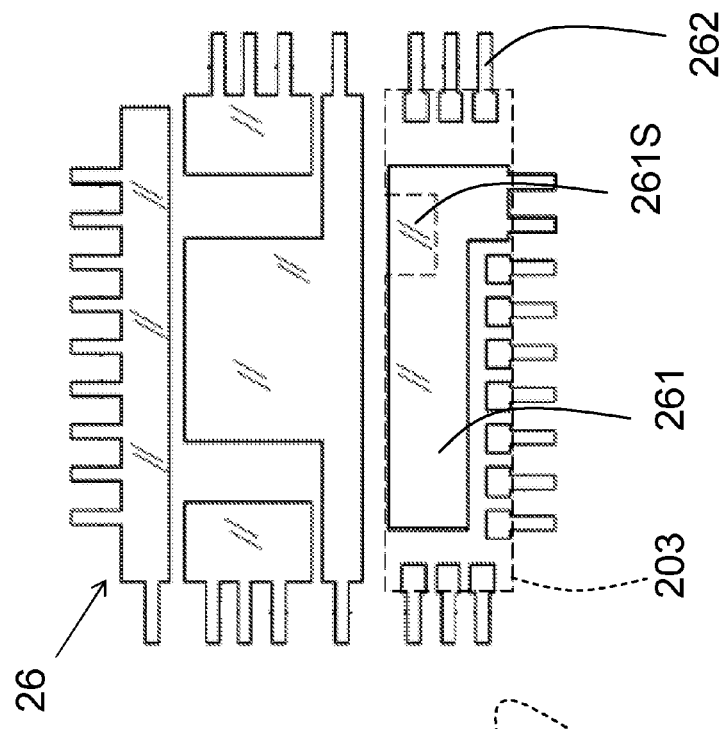
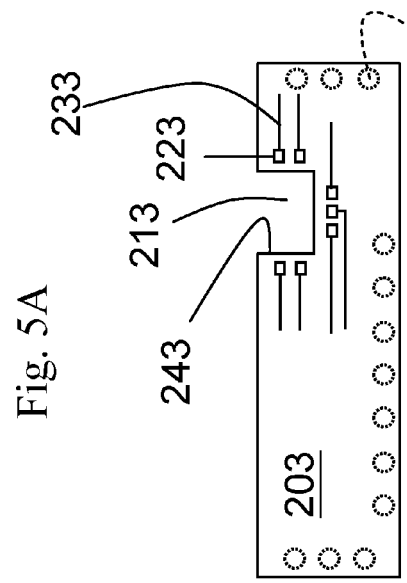

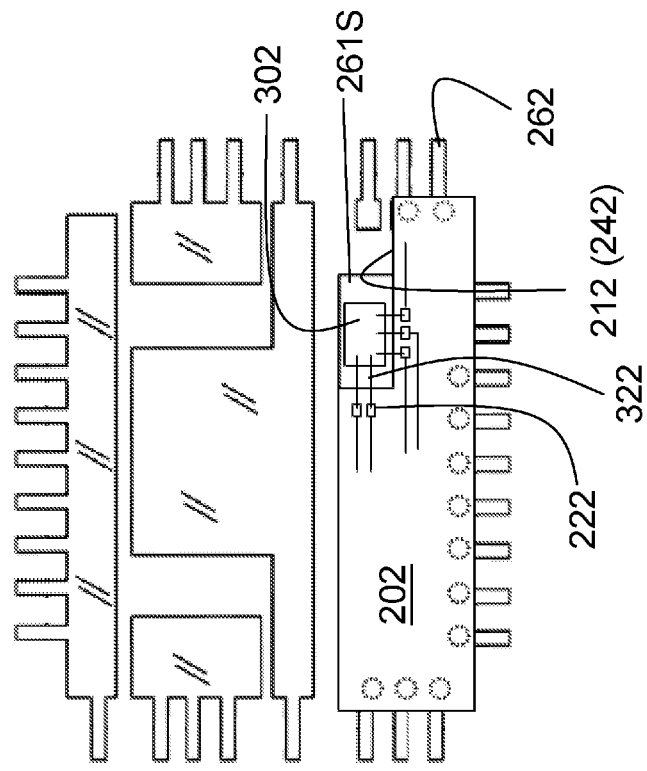
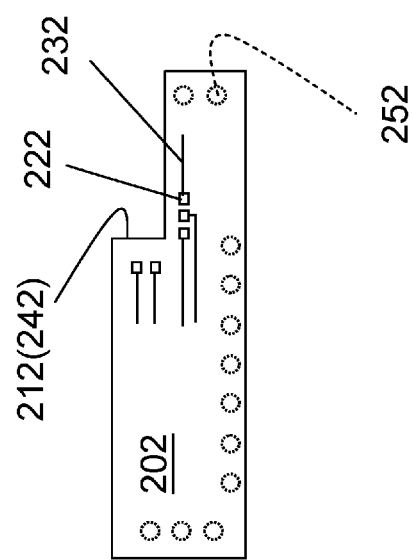
Fig. 6B
Fig. 6A

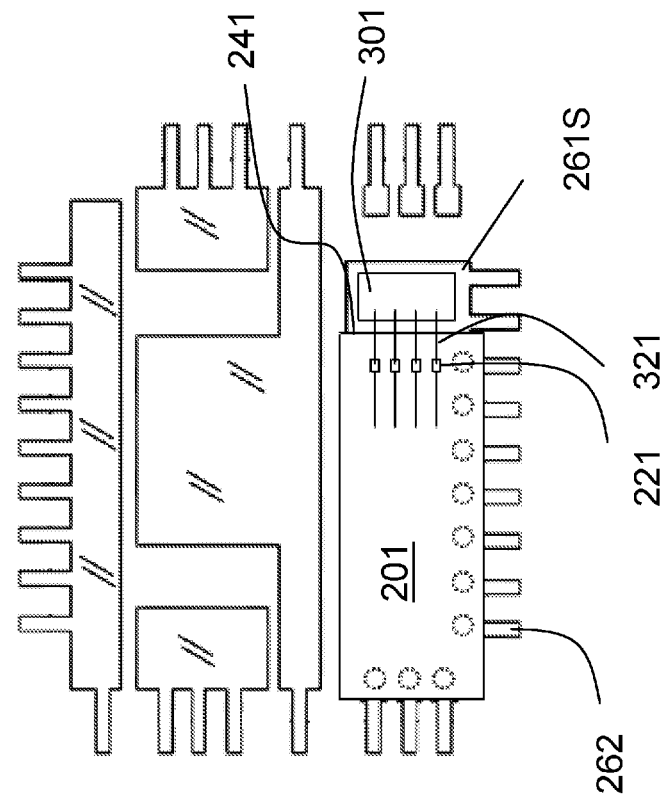
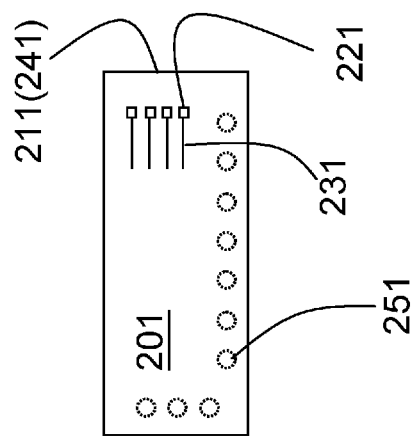
Fig. 7B
Fig. 7A

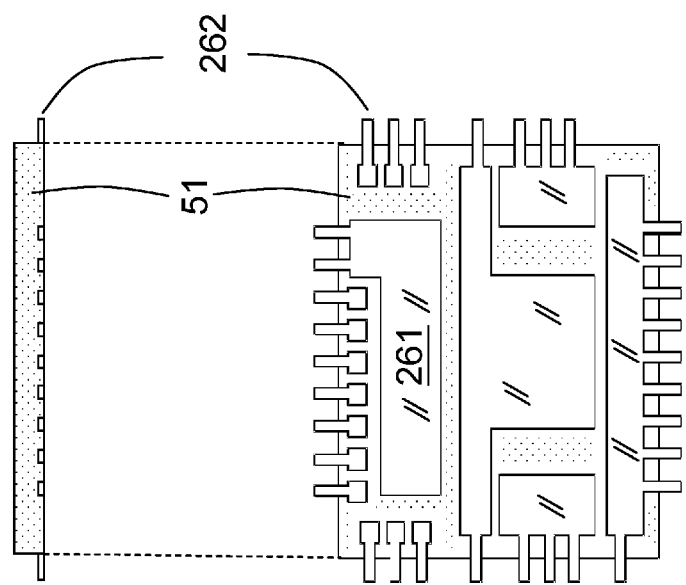

ELECTRONIC SYSTEM WITH A COMPOSITE SUBSTRATE

CROSS REFERENCE TO RELATED APPLICATIONS

This application is a continuation-in-part of U.S. patent application Ser. No. 12/705,389, filed Feb. 12, 2010, which is incorporated by referenced herein in their entirety.

BACKGROUND OF THE INVENTION

I. Field of the Invention

This invention relates to an electronic system with a composite substrate which is composed of a circuit board mounted on a lead frame.

II. Description of the Prior Art

FIG. 1 shows a prior art U.S. Pat. No. 6,212,086, it discloses a DC-to-DC converter system which includes a copper clad 110 on bottom for equal heat distribution. The prior art also includes a circuit board 120 mounted on the top surface of the copper clad 110. Electronic components including main transformer 130, output inductor 140, synchronous rectifiers 150, output capacitors 160, and input capacitors 170 are all mounted on the circuit boards 120. A discrete output connector is connected to the circuit board 120 through a flexible circuit board in the right side of the package.

However, one of the main disadvantages is that the circuit board 120 is not a good heat conductor for transferring the heat generated from the electronic components 120, 130, 140, 150, 160, and 170 downward to the copper clad 110. A circuit board is good for circuitry arrangement capability but not good for heat distribution for heat generating electronic components; while in contrast, a copper clad is good for heat distribution but not good for circuitry arrangement as compared to a circuit board. Persons skilled in the art have been striving for developing a substrate which displays both advantages—larger circuitry arrangement capability and good heat distribution capability.

SUMMARY OF THE INVENTION

One objective of present invention is to provide a composite substrate to dissipate heat effectively for chips or semiconductor devices.

In one embodiment, an electronic system with a composite substrate is disclosed, wherein the electronic system comprises: a lead frame having a chip mounting area and a plurality of metal leads arranged along a periphery of said chip mounting area, wherein each of plurality of metal leads is spaced from said chip mounting area by a gap; a circuit board disposed over the lead frame and having circuitry, said circuit board bridging the gap between each said metal lead and said chip mounting area; and a chip, mounted on said chip mounting area of said lead frame and electrically coupling to the circuitry of said circuit board.

In one embodiment, A an electronic system with a composite substrate is disclosed, wherein the electronic system comprises: a lead frame having a chip mounting area and a plurality of metal leads arranged along a periphery of said chip mounting area, wherein each of plurality of metal leads is spaced from said chip mounting area by a gap; a conductive pattern structure disposed over said lead frame and having circuitry, said conductive pattern structure bridging the gap between each said metal lead and said chip mounting area; and a chip, mounted on said chip mounting area of said lead frame and electrically coupling to the circuitry of said conductive pattern structure.

In one embodiment, A an electronic system with a composite substrate is disclosed, wherein the electronic system comprises: a lead frame having a chip mounting area and a plurality of metal leads; a chip having a plurality of terminals, mounted on said chip mounting area of said lead frame, wherein the metal leads of the lead frame and the plurality of terminals of the chip are substantially at the same horizontal level to form a first flat surface; and a conductive pattern structure disposed over the first flat surface to electrically couple the metal leads of the lead frame and the plurality of terminals of the chip.

BRIEF DESCRIPTION OF DRAWINGS

FIG. 2A is a top view of a circuit board used in the first embodiment according to the present invention FIG. 2B is a bottom view of FIG. 2A.

FIG. 2C is a lead frame used in the first embodiment according to the present invention.

FIG. 3 is the first composite substrate used in the first embodiment according to the present invention.

FIG. 4A is a top view of a first embodiment according to the present invention.

FIG. 4B is a bottom view of FIG. 4A.

FIG. 4C is an enlarged section view according to line AA' in FIG. 4A.

FIG. 4D is another enlarged section view according to line AA' in FIG. 4A.

FIG. 5A is a top view of a circuit board used in the second embodiment according to the present invention FIG. 5B is a lead frame used in the second embodiment according to the present invention.

FIG. 6A is a top view of a circuit board used in the third embodiment according to the present invention FIG. 6B is a top view of a third embodiment according to the present invention.

FIG. 7A is a top view of a circuit board used in the fourth embodiment according to the present invention FIG. 7B is a top view of a fourth embodiment according to the present invention.

FIG. 8A is a side view of the system sealed by a molding compound according to the present invention.

FIG. 8B is a bottom view of the system sealed by a molding compound according to the present invention.

DETAILED DESCRIPTION OF THE INVENTION

Figure 1:
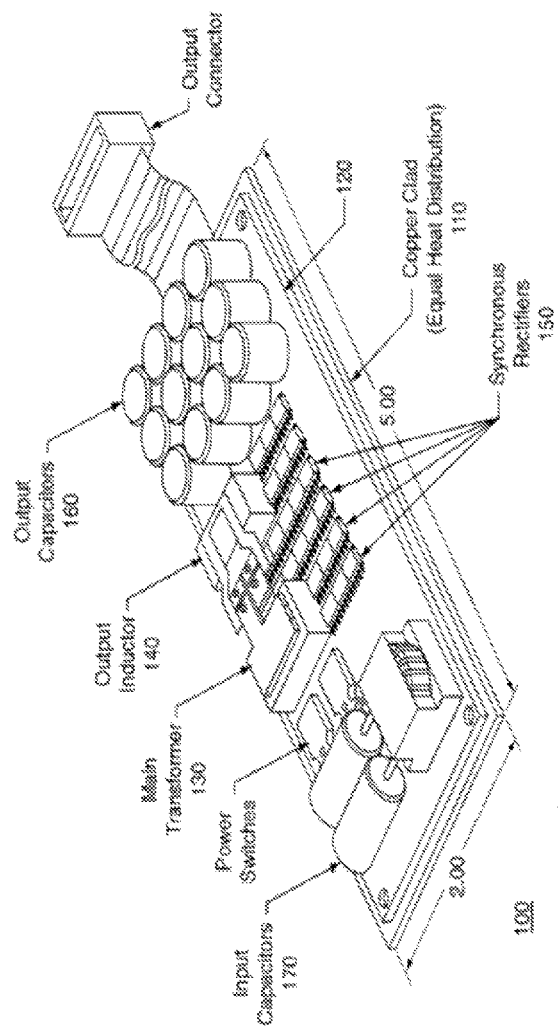
FIG. 1 is a prior art.

A composite substrate consisted of a circuit board mounted on a lead frame is used for a DC-to-DC converter system package. High heat generated electronic components such as an integrated circuit (IC) chip are mounted on the lead frame and relatively low heat generated electronic components are mounted on the circuit board. Metal lines are used for electrical coupling between the circuitry of the IC chip and the circuit board. An electronic system with the composite substrate gains both advantages—good circuitry arrangement capability from the circuit board and good heat distribution from the lead frame.

FIG. 2A is a top view of a circuit board used in the first embodiment according to the present invention FIG. 2A shows a circuit board 20 having a rectangular opening 21, a plurality of metal pads 22 surrounds the four sides 24 of the rectangular opening 21. The metal pads 22 are part of the circuitry (not shown) of the circuit board 20 and electrically couple to the circuitry of the circuit board 20 through metal lines 23.

FIG. 2B is a bottom view of FIG. 2A.

A plurality of bottom metal contacts 25 electrically coupling to the circuitry (not shown) of the circuit board 20 are made on bottom side 20B of the circuit board 20.

FIG. 2C is a lead frame used in the first embodiment according to the present invention.

A lead frame 26 has several large metal areas 261 adapted for carrying electronic components and a plurality of peripheral metal leads 262 distributes along the periphery of the lead frame 26 as the input/output leads for the system package. The circuit board 20 is going to be mounted on top side of the lead frame 26.

FIG. 3 is the first composite substrate used in the first embodiment according to the present invention.

The circuit board 20 of FIG. 2A is mounted on top of the lead frame 26 of FIG. 2C to form a first composite substrate 26C according to the present invention. Each of the bottom metal contacts 25 on the bottom side 20B of the circuit board 20 electrically couples to one of the peripheral metal leads 262 of the lead frame 26. The rectangular opening 21 of the circuit board 20 exposes metal surface 261S which is a partial surface of one of the large metal areas 261.

FIG. 4A is a top view of a first embodiment according to the present invention.

An IC chip 30 is mounted on the exposed metal surface 261S within the rectangular opening 21 of the circuit board 20. The circuitry (not shown) of the IC chip 30 electrically couples to the circuitry (not shown) of the circuit board 20 through metal wires 32 which electrically couple the metal pads 22 on the circuit board 20 to top metal contacts of the IC chip 30. The rectangular opening 21 has its four sides 24 neighboring to the four sides of the IC chip 30, this configuration gives four sides electrical coupling capacity for the circuitry coupling between the IC chip 30 and the circuit board 20.

FIG. 4B is a bottom view of FIG. 4A.

FIG. 4B is a bottom view of FIG. 4A. The bottom side 26CB of the composite substrate 26C as shown in FIG. 4A shows that the bottom surface of the large metal areas 261 and the bottom surface of the peripheral metal leads 262 of the lead frame 26 are coplanar.

FIG. 4C is an enlarged section view according to line AA' in FIG. 4A.

FIG. 4C shows an IC chip 30 is mounted on the metal surface 261S of one of the large metal areas 261 of the lead frame 26. The IC chip 30 has a thickness T1 which equals to or nears to the thickness T3 of the circuit board 20. The fact that the top surface of the IC chip 30 made near to the top surface of the circuit board 20 facilitates the metal wire 32 electrical coupling between the top metal contacts of the IC chip 30 and the metal pads 22 of the circuit board 20.

FIG. 4D is another enlarged section view according to line AA' in FIG. 4A.

FIG. 4D shows an IC chip 30B is mounted on a mat 27. The mat 27 is used when the IC chip 30B has a thickness T2 which is far below the thickness T3 of the circuit board 20. The mat 27 is used to elevate the height of the thinner IC chip 30B so that to make the top surface of the IC chip 30B near to the top surface of the circuit board 20.

FIG. 5A is a top view of a circuit board used in the second embodiment according to the present invention.

FIG. 5A shows a circuit board 203 having a U-shape indentation 213 in the periphery of the circuit board 203. A plurality of metal pads 223 surrounds the three sides 243 of the U-shape indentation 213. The metal pads 223 are part of the circuitry (not shown) of the circuit board 203 and electrically couple to the circuitry of the circuit board 203 through metal lines 233. A plurality of bottom metal contacts 253 electrically coupling to the circuitry (not shown) of the circuit board 203 are made on bottom side of the circuit board 203.

FIG. 5B is a lead frame used in the second embodiment according to the present invention.

A lead frame 26 has several large metal areas 261 adapted for carrying electronic components and a plurality of peripheral metal leads 262 distributes along the periphery of the lead frame 26 as the input/output leads for the system package. The circuit board 203 is going to be mounted on top side of the lead frame 26.

Figure 5C:
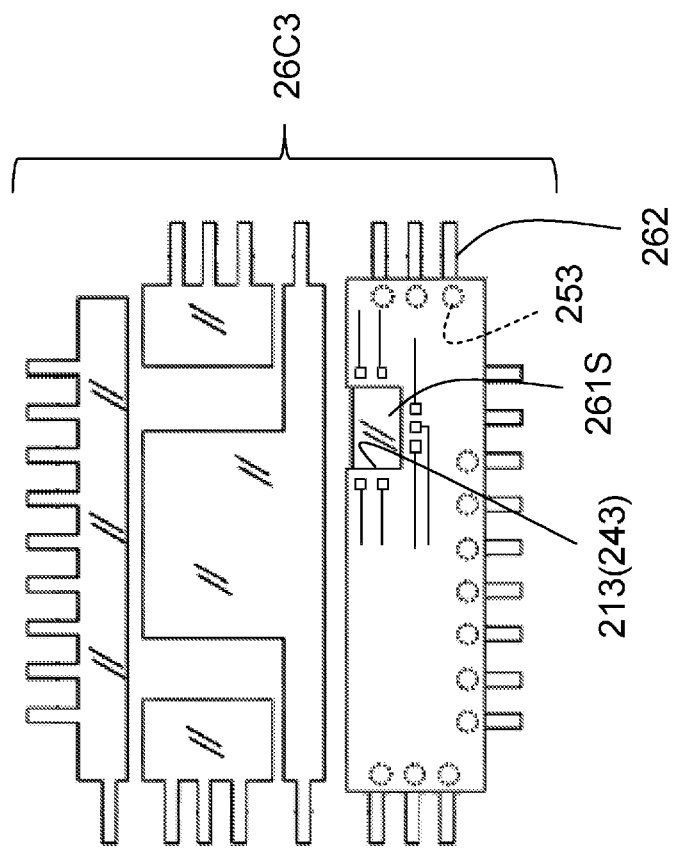
FIG. 5C is the second composite substrate used in the second embodiment according to the present invention.

FIG. 5C is the second composite substrate used in the second embodiment according to the present invention.

The circuit board 203 of FIG. 5A is mounted on top of the lead frame 26 of FIG. 5B to form a second composite substrate 26C3 according to the present invention. Each of the bottom metal contacts 253 on the bottom side of the circuit board 203 electrically couples to one of the peripheral metal leads 262 of the lead frame 26. The U-shape indentation 213 of the circuit board 203 exposes metal surface 261S which is a partial surface of one of the large metal areas 261.

Figure 5D:
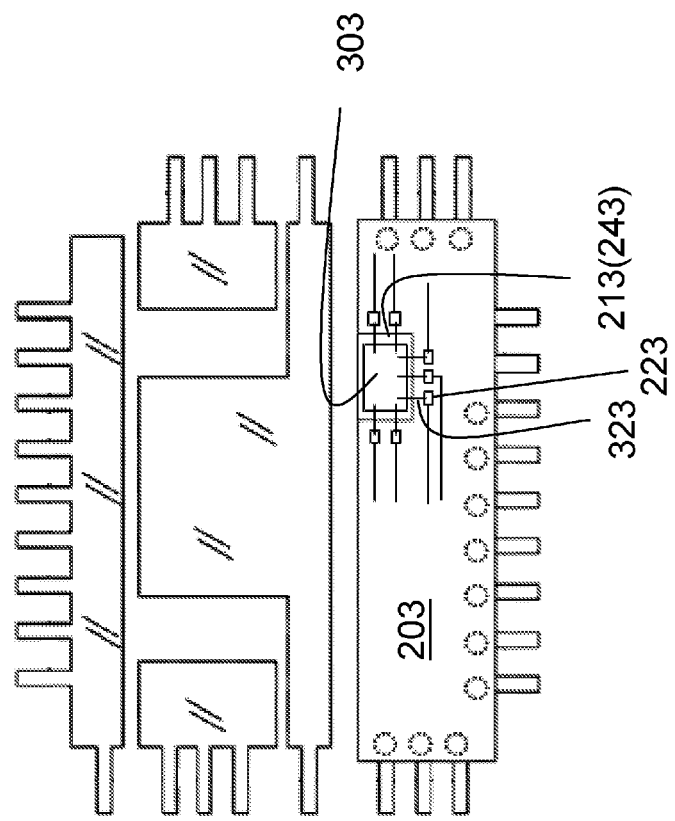
FIG. 5D is a top view of a second embodiment according to the present invention.

FIG. 5D is a top view of a second embodiment according to the present invention.

An IC chip 303 is mounted on the exposed metal surface 261S within the U-shape indentation 213 of the circuit board 203. The circuitry (not shown) of the IC chip 303 electrically couples to the circuitry (not shown) of the circuit board 203 through metal wires 323 which electrically couple the metal pads 223 on the circuit board 203 to top metal contacts of the IC chip 303. The U-shape indentation 213 has its three sides 243 neighboring to the three sides of the IC chip 303, this configuration gives three sides electrical coupling capacity for the circuitry coupling between the IC chip 303 and the circuit board 203.

FIG. 6A is a top view of a circuit board used in the third embodiment according to the present invention.

FIG. 6A shows a circuit board 202 having an L-shape indentation 212 in the periphery of the circuit board 202. A plurality of metal pads 222 neighboring to the two sides 242 of the L-shape indentation 212. The metal pads 222 are part of the circuitry (not shown) of the circuit board 202 and electrically couple to the circuitry of the circuit board 202 through metal lines 232. A plurality of bottom metal contacts 252 electrically coupling to the circuitry (not shown) of the circuit board 202 are made on bottom side of the circuit board 202.

FIG. 6B is a top view of a third embodiment according to the present invention.

In this embodiment, basic concept is similar to previous embodiments; the only difference is that a circuit board 202 of FIG. 6A which has an L-shape indentation 212 is used. An IC chip 302 is mounted on the exposed metal surface 261S within the L-shape indentation 212 of the circuit board 202. The circuitry (not shown) of the IC chip 302 electrically couples to the circuitry (not shown) of the circuit board 202 through metal wires 322 which electrically couple the metal pads 222 on the circuit board 202 to top metal contacts of the IC chip 302. The L-shape indentation 212 has its two sides 242 neighboring to the two sides of the IC chip 302, this configuration gives two sides electrical coupling capacity for the circuitry coupling between the IC chip 302 and the circuit board 202.

FIG. 7A is a top view of a circuit board used in the fourth embodiment according to the present invention FIG. 7A shows a circuit board 201 having a flat side 211 in the periphery of the circuit board 201. A plurality of metal pads 222 neighboring to the two sides 242 of the L-shape indentation 212. The metal pads 221 are part of the circuitry (not shown) of the circuit board 201 and electrically couple to the circuitry of the circuit board 201 through metal lines 231. A plurality of bottom metal contacts 251 electrically coupling to the circuitry (not shown) of the circuit board 201 are made on bottom side of the circuit board 201.

FIG. 7B is a top view of a fourth embodiment according to the present invention.

In this embodiment, basic concept is similar to previous embodiments; the only difference is that a circuit board 201 which has a flat side 241 is used. An IC chip 301 is mounted on the exposed metal surface 261S neighboring to the flat side 241 of the circuit board 201. The circuitry (not shown) of the IC chip 301 electrically couples to the circuitry (not shown) of the circuit board 201 through metal wires 321 which electrically couple the metal pads 221 on the circuit board 201 to top metal contacts of the IC chip 301. The flat side 241 neighbors to the single side of the IC chip 301, this configuration gives single side electrical coupling capacity for the circuitry coupling between the IC chip 301 and the circuit board 201.

FIG. 8A is a side view of the system sealed by a molding compound according to the present invention.

FIG. 8A shows each of the packages of FIG. 4A, FIG. 5D, FIG. 6B and FIG. 7B sealed by a molding compound 51. The outer ends of the peripheral metal leads 262 protrude outside of the molding compound 51. The bottom surface of the molding compound 51 flushes the bottom surfaces of the peripheral leads 262.

FIG. 8B is a bottom view of the system sealed by a molding compound according to the present invention.

The bottom surface of the molding compound 51 flushes the bottom surfaces of the large metal areas 261 so that a flat bottom system is finished, in other words, a flat bottom surface mount system is finished.

It is well known that a circuit board can be made by using PCB process to form a conductive pattern structure; and the conductive pattern structure can be made by a lithography process to form conductive patterns on a substrate for connecting electronic devices. Therefore, they are many different ways to form a conductive pattern structure for connecting chips, dies, electronic devices, etc.

In one embodiment, an electronic system with a composite substrate is described, wherein the electronic system comprises: a lead frame having a chip mounting area and a plurality of metal leads arranged along a periphery of said chip mounting area, wherein each of plurality of metal leads is spaced from said chip mounting area by a gap; a conductive pattern structure disposed over said lead frame and having circuitry, said conductive pattern structure bridging the gap between each said metal lead and said chip mounting area; and a chip, mounted on said chip mounting area of said lead frame and electrically coupling to the circuitry of said conductive pattern structure.

In one embodiment, the conductive pattern structure has a bottom surface to encapsulate the chip, wherein the bottom surface comprises a plurality of contacts, wherein each of the plurality of contacts is electrically coupling to a corresponding metal lead of the plurality of metal leads of the lead frame. In one embodiment, the conductive pattern structure comprises a plurality of conductive pattern layers disposed over the said lead frame and the chip to electrically connect each said metal lead and the chip. In one embodiment, the plurality of conductive pattern layers are formed over the said lead frame and the chip by lithography process.

In one embodiment, the conductive pattern structure has a top surface, and the electronic system further comprises at least one electronic component disposed on the top surface, wherein at least one electronic component is electrically coupling to the circuitry of said conductive pattern structure through the said plurality of conductive pattern layers. In one embodiment, each of the at least one electronic component has lower heat generation than said chip.

In one embodiment, the chip comprises a plurality of pins, wherein said pins are electrically coupling to the circuitry of the conductive pattern structure through the plurality of conductive pattern layers.

In one embodiment, the electronic system further comprises a molding compound to encapsulate the lead frame and the chip to form a flat surface before disposing the conductive pattern structure over the said lead frame, wherein the contacts or pins of the lead frame and the chip are exposed for connecting to the circuitry of the conductive pattern structure. In one embodiment, the top surface of the lead frame and the top surface of the chip are substantially at the same height or horizontal level to form a flat surface for disposing the plurality of the conductive layers over the flat surface.

Figure 9A:
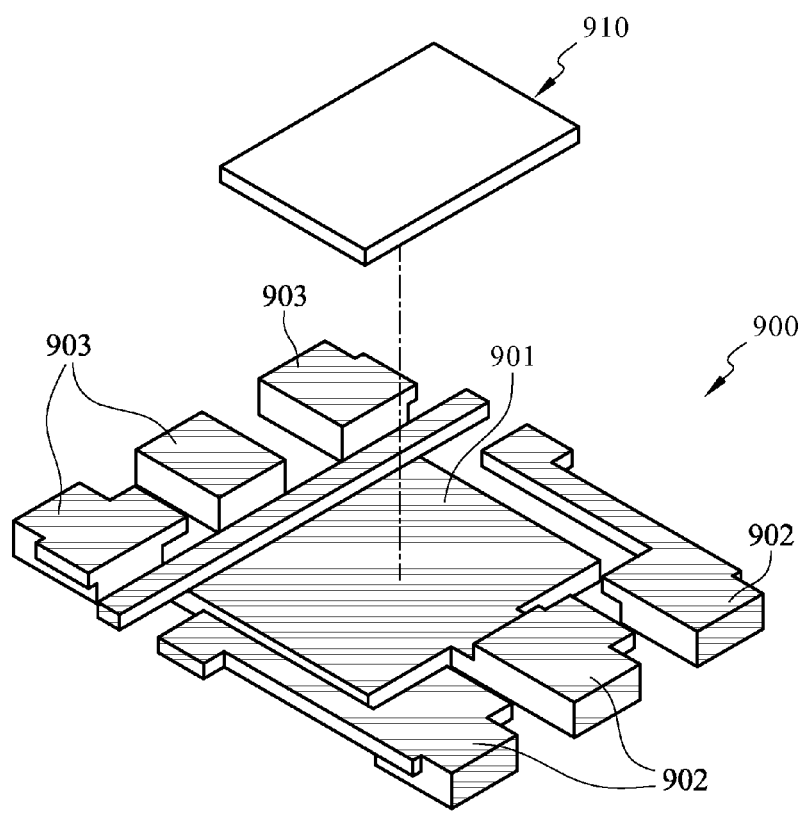
FIG. 9A depicts a top view of a lead frame 900 and a chip or a semiconductor device 910.

As shown in FIG. 9A which depicts a top view of a lead frame 900 and a chip or a semiconductor device 910 to be mounted on the lead frame; the lead frame 900 has a chip mounting area having a first flat surface 901 for mounting the chip or the semiconductor device 910, wherein the lead frame has a plurality of metal leads 902, 903. In one embodiment, each metal lead and the chip mounding area is separated by a gap; and chip is mounded on the chip mounting area of the lead frame. In one embodiment, one metal lead is connected to the chip mounding area. The semiconductor device 910 can be in bare die form before packaging. Please note that the lead frame 900 can be in many different shapes and not limited to the example shown in this embodiment.

Figure 9B:
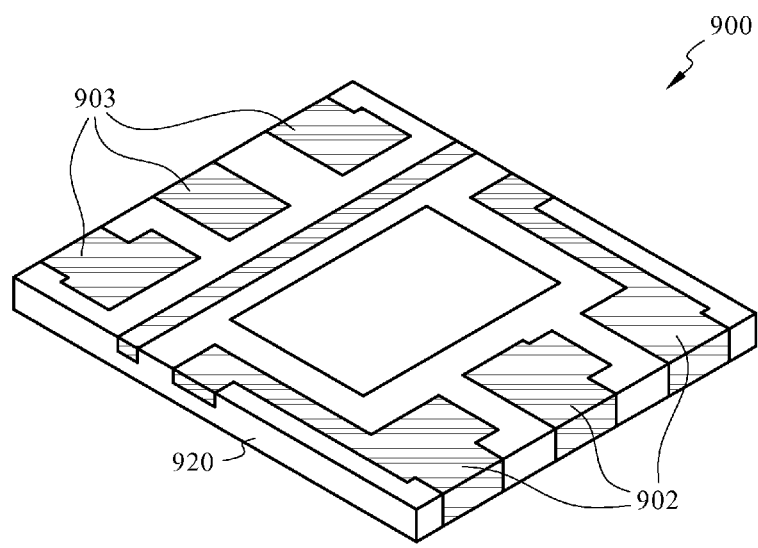
FIG. 9B which depicts a top view of an encapsulated structure of the lead frame 900 and the semiconductor device 910.

As shown in FIG. 9B which depicts a top view of an encapsulated structure of the lead frame 900 and the semiconductor device 910, wherein a molding compound 920 encapsulates the lead frame 900 and the chip 910 to form a second flat surface 930 before disposing the conductive pattern structure over the said lead frame. The metal leads and the I/O terminals of the chip are exposed outside the molding compound so that a conductive structure can be laid on the second flat surface to electrically couple the metal leads and the terminals of the chip. In one embodiment, the metal leads and a top surface of the chip are substantially at the same horizontal level to form a flat surface so that a plurality of conductive pattern layers can be disposed on the flat surface. The top surface of the chip has a plurality of I/O terminals for electrically connecting with other components.

Figure 9C:
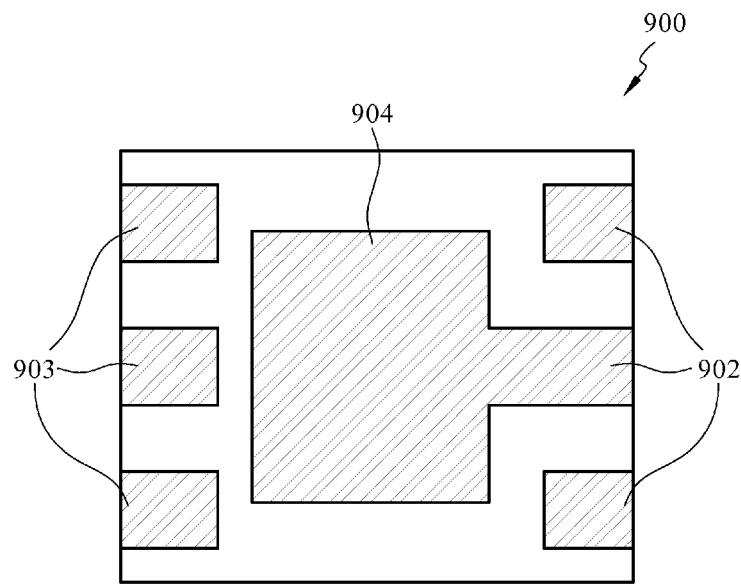
FIG. 9C which depicts a bottom view of the encapsulated structure of the lead frame 900 and the semiconductor device 910.

As shown in FIG. 9C which depicts a bottom view of the encapsulated structure of the lead frame 900 and the semiconductor device 910, the chip mounting area 904 of the lead frame 900 is exposed and aligned with the bottom surface; and a plurality of pads are disposed the bottom surface and each pad is connected to a metal lead 902, 903 of the lead frame 900.

Figure 9D:
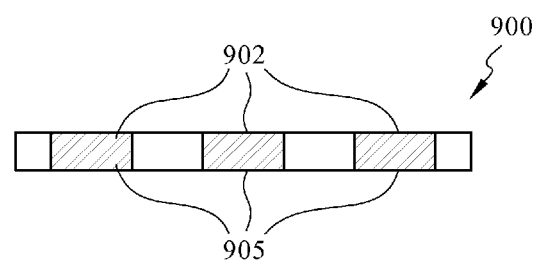
FIG. 9D which depicts a side view of the encapsulated structure of the lead frame 900 and the semiconductor device 910.

As shown in FIG. 9D which depicts a side view of the encapsulated structure of the lead frame 900 and the semiconductor device 910, wherein each metal leads 902 has a side surface 905 respectively.

Figure 10:
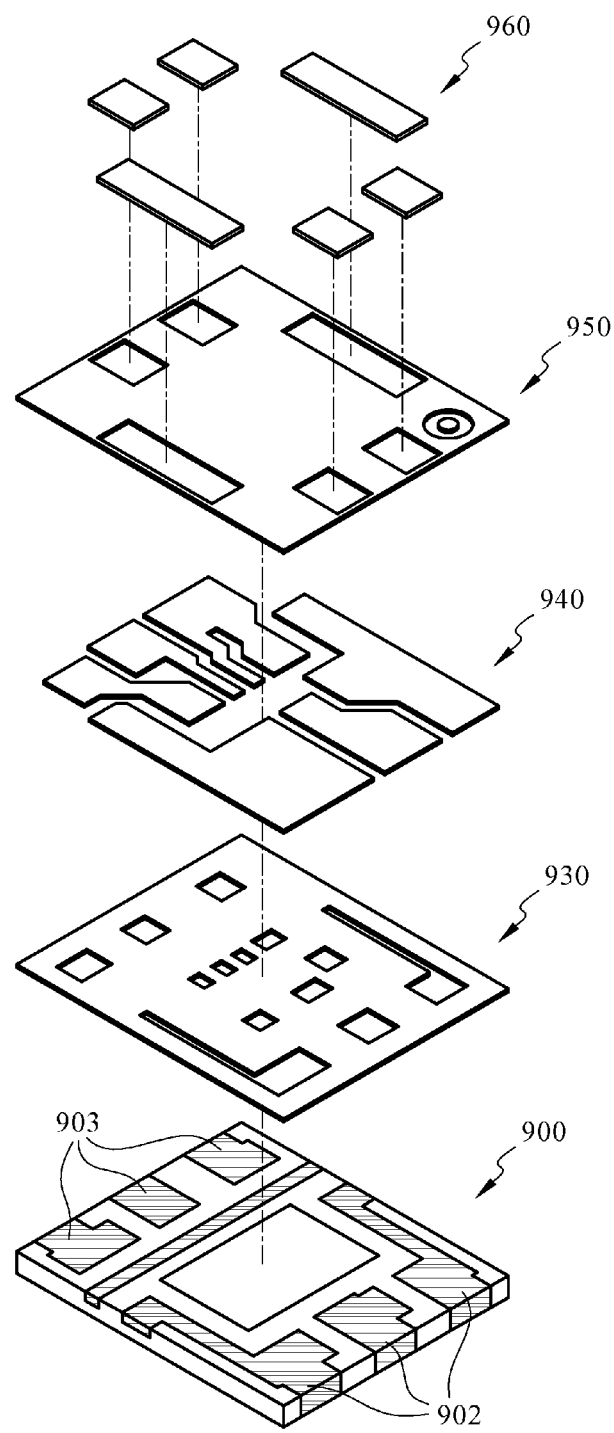
FIG. 10, the plurality conductive pattern layers are form on the lead frame and the chip.

As shown in FIG. 10, the plurality conductive pattern layers are form on the lead frame and the chip; and the top surface of the conductive pattern layers 930, 940, 950 has a plurality of pads 960 for mounting other components such as capacitor, resistor, inductor, or any other devices.

Figure 11:
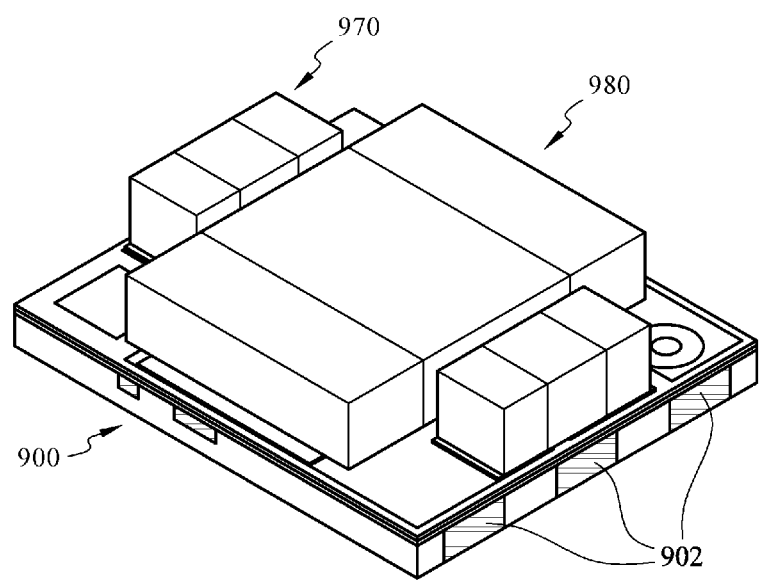
FIG. 11 depicts a top view of the electronic system after all the components are assembled.

FIG. 11 depicts a top view of the electronic system after all the components are assembled, wherein a first electronic component 970, such as a capacitor, resistor, inductor or other devices, and a second electronic component 980 such as a capacitor, resistor, inductor or other devices, are attached to the pads on the top surface of the conductive layers.

In one embodiment, the chip is a semiconductor die with a plurality of I/O contacts, wherein said I/O contacts are electrically coupling to the circuitry of the conductive pattern structure through the plurality of conductive pattern layers.

In one embodiment, the system further comprises a molding compound, the molding compound having a bottom surface flush with bottom surfaces of said lead frame to form a flat surface mount package.

While several embodiments have been described by way of example, it will be apparent to those skilled in the art that various modifications may be made without departing from the spirit of the present invention. Such modifications are all within the scope of the present invention, as defined by the appended claims.

What is claimed is:

1. An electronic system with a composite substrate, comprising:
   a lead frame having a chip mounting area and a plurality of metal leads arranged along a periphery of said chip mounting area, wherein each of the plurality of metal leads is spaced from said chip mounting area by a gap;
   a conductive pattern structure disposed over said lead frame and having circuitry, said conductive pattern structure bridging the gap between each said metal lead and said chip mounting area; and
   a chip, mounted on said chip mounting area of said lead frame and electrically coupling to the circuitry of said conductive pattern structure, wherein a bottom surface of said conductive pattern structure comprises a plurality of contacts and a bottom surface of each of the plurality of metal leads that is located below a bottom surface of said chip extends upright to a portion of the top surface of the metal lead that is in contact with and electrically connected to a corresponding contact of said conductive pattern structure.

2. The electronic system according to claim 1, wherein the chip mounting area is substantially flat.

3. The electronic system according to claim 2, wherein the top surface of the metal leads of the lead frame and the top surface of the chip are substantially at the same horizontal level to form a flat surface for disposing the plurality of the conductive layers over the flat surface.

4. The electronic system according to claim 1, wherein the bottom surface of said conductive pattern structure encapsulates the chip.

5. The electronic system according to claim 1, wherein said conductive pattern structure comprises a plurality of conductive pattern layers disposed over the said lead frame and the chip to electrically connect each said metal lead and the chip.

6. The electronic system according to claim 5, wherein said plurality of conductive pattern layers are formed over the said lead frame and the chip by lithography process.

7. The electronic system according to claim 5, wherein said chip comprises a plurality of pins, wherein said pins are electrically coupling to the circuitry of the conductive pattern structure through the plurality of conductive pattern layers.

8. The electronic system according to claim 1, further comprising at least one electronic component disposed on the top surface of said conductive pattern structure, wherein said at least one electronic component is electrically coupling to the circuitry of said conductive pattern structure.

9. The electronic system according to claim 1, further comprising: a molding compound to encapsulate said lead frame to form a first flat surface before disposing the conductive pattern structure over the first flat surface.

10. The electronic system according to claim 1, further comprising a molding compound to encapsulate the lead frame, the chip and the conductive pattern structure, wherein at least one portion of said bottom surface of each metal lead that is located below said bottom surface of the chip is exposed outside the molding compound for connecting with an external circuit.

11. The electronic system according to claim 1, wherein the chip is a semiconductor die with a plurality of I/O contacts.

12. The electronic system according to claim 1, wherein the top surface of said conductive pattern structure further comprises additional contacts that are electrically coupling to the circuitry of the conductive pattern structure and said chip.

13. The electronic system according to claim 1, wherein said conductive pattern structure is a circuit board.

14. An electronic system with a composite substrate, comprising:
   a lead frame having a metal body and a plurality of metal leads arranged along a periphery of said metal body, wherein each of the plurality of metal leads is spaced from said metal body by a gap;
   a conductive pattern structure disposed over said lead frame and having circuitry, said conductive pattern structure bridging the gap between each said metal lead and said metal body; and
   an electronic component, disposed on said metal body of said lead frame and electrically coupling to the circuitry of said conductive pattern structure, wherein a bottom surface of said conductive pattern structure comprises a plurality of contacts and a bottom surface of each of the plurality of metal leads that is located below a bottom surface of said electronic component extends upright to a portion of the top surface of the metal lead that is in contact with and electrically connected to a corresponding contact of said conductive pattern structure.

15. The electronic system according to claim 14, wherein said conductive pattern structure is a circuit board.

16. The electronic system according to claim 14, further comprising a molding compound to encapsulate the lead frame, the electronic component and said conductive pattern structure, wherein at least one portion of said bottom surface of each metal lead that is located below said bottom surface of the electronic component is exposed outside the molding compound for connecting with an external circuit.

\* \* \* \* \*